United States Patent [19]

Yokoyama

[11] Patent Number: 4,560,946
[45] Date of Patent: Dec. 24, 1985

[54] POWER AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 591,675

[22] Filed: Mar. 21, 1984

[30] Foreign Application Priority Data

Mar. 24, 1983 [JP] Japan .................................. 58-49409

[51] Int. Cl.$^4$ ............................................. H03F 1/32
[52] U.S. Cl. ...................... 330/149; 330/10; 330/84; 330/146; 330/267; 330/297
[58] Field of Search .................... 330/10, 84, 146, 149, 330/207 A, 251, 267, 273, 297

[56] References Cited

FOREIGN PATENT DOCUMENTS 58-13004 1/1983 Japan .................................... 330/149

Primary Examiner—James B. Mullins
Attorney, Agent, or Firm—Spensley, Horn, Jubas & Lubitz

[57] ABSTRACT

A power amplifier with a low distortion and a high power efficiency includes a first amplifier of the low distortion type for being powered by a first voltage source to amplify an input signal thereto to apply an output signal to a first terminal, and a second amplifier of the high power efficiency type for being powered by a second voltage source to amplify the input signal to apply an output signal to a second terminal. A load is connected between the first and second terminals. The output voltage of the second voltage source is greater than that of the first voltage source. A first feedback path is provided for feeding back the output signal of the first amplifier to an input thereof. A second feedback path is provided for feeding back the output signal of the second amplifier to the input of the first amplifier.

19 Claims, 8 Drawing Figures

POWER AMPLIFIER

BACKGROUND OF THE INVENTION

1. Field of the Invention

The present invention relates to a power amplifier and more particularly to a power amplifier for audio apparatuses having an improved power efficiency and distortion characteristic, which can be manufactured at low costs.

2. Prior Art

There has been proposed a power amplifier which realizes high power efficiency and low distortion by combining an amplifier circuit having a low distortion factor and an amplifier circuit having a high power efficiency. In the construction of one such conventional power amplifier, a neutral point between positive and negative power supply sources for powering an amplifier to amplify an input signal thereof in a Class-A mode is driven by an output of another amplifier which functions to amplify the above-mentioned input signal in a Class-B mode. More specifically, as shown in FIG. 1, a first amplifier 1 amplifies an input signal, applied to an input terminal 2, in a Class-A mode and delivers an amplified input signal to a loudspeaker 3, the amplifier 1 having a pair of positive and negative voltage input terminals connected respectively to serially-connected floating voltage sources 4a and 4b each having an output voltage $V_L$. The voltage $V_L$ is set to the minimum level required for the operation of the amplifier 1. A second amplifier 5 amplifies the input signal in a Class-B mode and has a pair of positive and negative voltage input terminals supplied respectively with output voltages $+V_H$ and $-V_H$ of fixed voltage sources 6a and 6b ($V_H > V_L$). With this construction, the output of the second amplifier 5 drives the junction point of the floating voltage sources 4a and 4b. Thus, the voltage sources 4a and 4b produce the output voltage set to the minimum level required for operating the first amplifier 1 in a Class-A mode, and the junction point of the voltage sources 4a and 4b is varied in accordance with the input signal. With this arrangement, the conventional power amplifier of FIG. 1 achieves improved distortion and dynamic range. However, this power amplifier has the following disadvantages:

(a) In the case where the floating voltage sources 4a and 4b are of such a construction that ac voltage is rectified to produce an output voltage, common-mode noises may appear on the output voltage of this power amplifier due to stray capacitance of coils of the associated transformer.

(b) In the case where the power amplifier is used in a stereo sound system, the floating voltage sources 4a and 4b must be provided in each of right and left channels of the stereo sound system. This increases the manufacturing cost of the system.

(c) When the input signal of a great amplitude is applied to the first amplifier 1, the output voltage increases to a level almost equal to the output voltages $+V_H$ and $-V_H$ of the voltage sources 6a and 6b. Therefore, such voltages $+V_H$ and $-V_H$ must be supplied to those stages of the amplifier 1 up to its drive stage, so that these stages must be composed of circuit elements resistant to a high voltage. This also increases the manufacturing cost of the power amplifier.

SUMMARY OF THE INVENTION

It is therefore an object of this invention to provide a power amplifier of the type which eliminates the above-mentioned deficiencies of the conventional power amplifier.

Another object is to provide such a power amplifier which can realize a high power efficiency and improved distortion characteristics.

A further object is to provide such a power amplifier which obviates the need for floating voltage sources, thereby reducing the manufacturing cost.

A still further object is to provide such a power amplifier which can be manufactured at low costs by reducing high voltage-resistant circuit elements.

According to the present invention, there is provided a power amplifier comprising an input terminal for being supplied with an input signal; first and second terminals for connecting a load therebetween; first amplifier means for being supplied with a voltage from a first voltage source to amplify the input signal to apply an output signal to the first terminal; second amplifier means for being supplied with a voltage from a second voltage source to amplify the input signal to apply an output signal to the second terminal, the voltage from the second voltage source being greater than the voltage from the first voltage source, the second amplifier means having a higher power efficiency than the first amplifier means, and the first amplifier means having lower distortion characteristics than the second amplifier means; first feedback path means for feeding back the output signal of the first amplifier means to an input thereof; and second feedback path means for feeding back the output signal of the second amplifier means to the input of the first amplifier means.

DESCRIPTION OF THE PREFERRED EMBODIMENTS OF THE INVENTION

Figure 1:
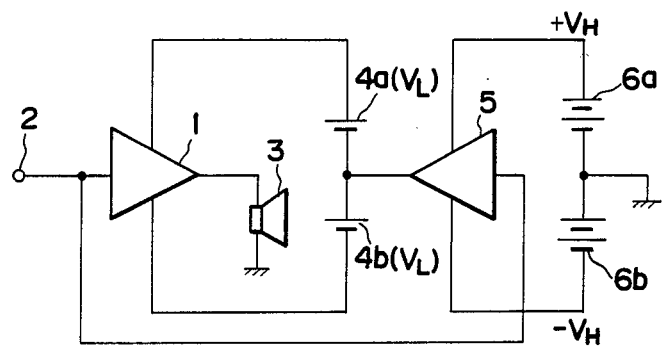
FIG. 1 is a circuit diagram of a conventional power amplifier.

The invention will now be described with reference to the drawings in which like reference characters denote corresponding parts in several views.

Figure 2:
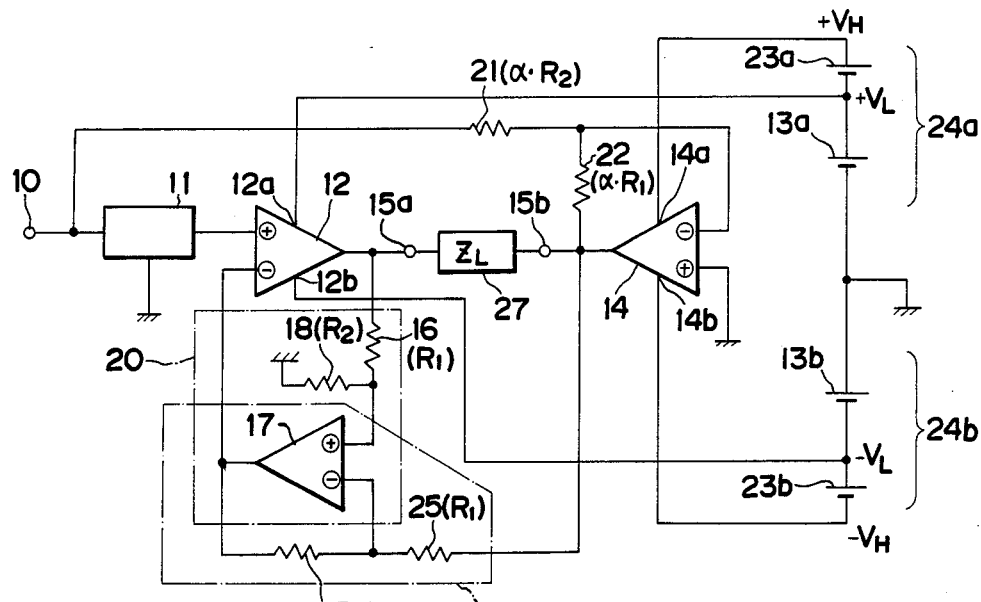
FIG. 2 is a circuit diagram of a power amplifier provided in accordance with the present invention.

FIG. 2 shows a circuit diagram of a power amplifier according to the present invention. An input terminal 10 is connected via an equalizer circuit 11 to a non-inverting input terminal of a first amplifier 12 in the form of an operational amplifier, the first amplifier 12 being operative in a Class-A mode. Output voltages $+V_L$ and $-V_L$ of voltage sources 13a and 13b (first voltage source means) are supplied to positive and negative voltage input terminals 12a and 12b of the first amplifier 12, respectively. The ouput voltages $+V_L$ and $-V_L$ are set to the minimum level required for operating the first amplifier 12 in a Class-A mode. The equalizer circuit 11 serves to coincide transfer functions of first and second amplifiers 12 and 14 with each other. The output terminal of the amplifier 12 is connected to a terminal 15a and also connected to a non-inverting input terminal of an operational amplifier 17 via a resistor 16 having a value R1. The non-inverting input terminal of the operational amplifier 17 is grounded via a resistor 18 having a value R2, and a resistor 19 having a value R2 is coupled between the non-inverting input terminal and output terminal of the operational amplifier 17. Also, the output terminal of the operational amplifier 17 is connected to the inverting input terminal of the amplifier 12. In this case, the circuit 20 composed of the resistors 16 and 18 and the operational amplifier 17 constitutes a first feedback path in the power amplifier.

The input terminal 10 is connected to an inverting input terminal of the second amplifier 14 via a resistor 21 having a value of ($a$·R2). The second amplifier 14 is operative in a Class-B mode. A non-inverting input terminal of the amplifier 14 is grounded, and a resistor 22 having a value of ($a$·R1) is coupled between the inverting input terminal and output terminal of the amplifier 14. A positive voltage input terminal 14a of the amplifier 14 is supplied with an output voltage $+V_H$ of a voltage source 24a composed of the voltage source 13a and a voltage source 23a connected in series therewith. On the other hand, a negative voltage input terminal 14b of the amplifier 14 is supplied with an output voltage $-V_H$ of a voltage source 24b composed of the voltage source 13b and a voltage source 23b connected in series therewith. The output terminal of the amplifier 14 is connected to a terminal 15b and also connected to the inverting input terminal of the operational amplifier 17 via a resistor 25 having a value R1. In this case, the circuit 26 composed of the resistors 19 and 25 and the operational amplifier 17 constitutes a second feedback path in the power amplifier. A load or loudspeaker 27 having a value $Z_L$ is connected between the terminals 15a and 15b.

Figure 3:
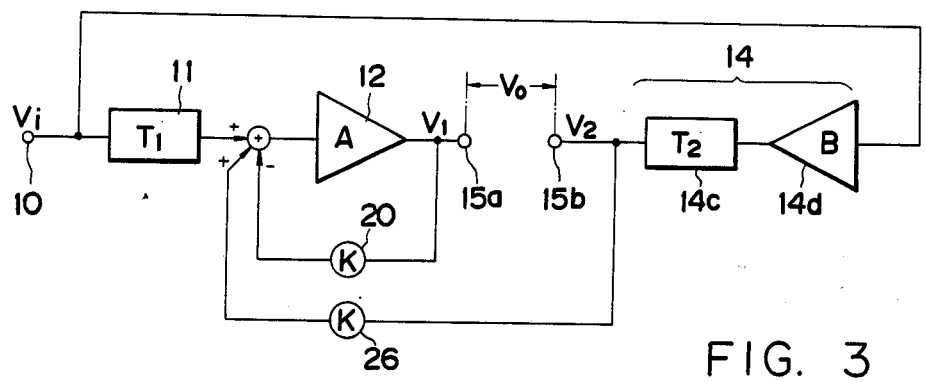
FIG. 3 is a circuit diagram of an equivalent circuit of the power amplifier of FIG. 2.

Characteristics of the power amplifier of FIG. 2 will now be described with reference to its equivalent circuit of FIG. 3 in which the transfer function T(s) of the equalizer circuit 11 is represented by T1, the gain of the amplifier 12 by A, and the gain of each of the first and second feedback paths 20 and 26, i.e., R2/R1, by K. The amplifier 14 is shown as being composed of a transfer element 14c having a transfer function T2 and an ideal amplifier 14d having a gain B.

In this equivalent circuit, the following equation is obtained:

$$V1 = (Vi \cdot T1 + (V2 - V1) \cdot K) \cdot A \quad (1)$$
$$= (Vi \cdot T1 - Vo \cdot K) \cdot A$$

Wherein Vi represents the voltage of the input signal applied to the input terminal 10, V1 the output voltage of the first amplifier 12, V2 the output voltage of the second amplifier 14, and Vo a voltage across the terminals 15a and 15b.

Also, the following equation is obtained:

$$V2 = Vi \cdot T2 \cdot B \quad (2)$$

Therefore, the voltage Vo is represented by the following:

$$\begin{aligned} Vo &= V1 - V2 \\ Vo &= (Vi \cdot T1 - Vo \cdot K) \cdot A - Vi \cdot T2 \cdot B \\ Vo &= Vi \cdot (T1 \cdot A - T2 \cdot B) - Vo \cdot K \cdot A \\ Vo \cdot (1 + K \cdot A) &= Vi \cdot (T1 \cdot A - T2 \cdot B) \end{aligned} \quad (3)$$

Gain G of the power amplifier is obtained from the equation (3) in the following manner:

$$G = Vo/Vi = (T1 \cdot A - T2 \cdot B)/(1 + K \cdot A) \quad (4)$$

If the gain A is infinite as indicated in the following equation (5), the following equation (6) is obtained:

$$A = \infty \quad (5)$$

$$G = T1/K \quad (6)$$

On the other hand, even if the gain A is finite, the following equation (7) is obtained when the following equations (8) and (9) are established:

$$G = T/K \quad (7)$$

$$B = -1/K \quad (8)$$

$$T1 = T2 = T \quad (9)$$

Therefore, it will be appreciated that the gain G of the power amplifier has nothing to do with the gain B if either the equation (5) or the equations (8) and (9) are established, so that the distortion of the power amplifier becomes very low.

In the power amplifier of FIG. 2, the above equations (8) and (9) are established when the following equations (10) and (11) are given and when the transfer function T(s) of the equalizer circuit 11 coincides with the frequency characteristics of the amplifier 14. In this case, T2 is ignored, and the gain G of the power amplifiers is R1/R2.

$$K = R2/R1 \quad (10)$$

$$B = -a \cdot R1/a \cdot R2 = -1/K \quad (11)$$

If the amplifier 14 is replaced by a Class-D amplifier, that is, a pulse width modulation amplifier, the power amplifier can achieve a higher power efficiency. In this case, the equalizer circuit 11 comprises a filter circuit having the same frequency characteristics as a pulse width demodulation filter circuit of the above-mentioned pulse width modulation amplifier.

When the above equations (8) and (9) are established, the amplifier 12 produces a voltage sufficient only to cancel the distortion produced by the amplifier 14. Therefore, the output voltages $\pm V_L$ of the voltage sources of the amplifier 12 can be much smaller than the output voltages $\pm V_H$, so that the power loss of the amplifier 12 can be kept to a minimum. In addition, the amplifier 12 can be composed of circuit elements having a relatively low voltage-resistance, and therefore the amplifier can be manufactured at low costs. The amplifier 17 functions as a voltage amplifier and therefore may be one with a small power capacity, in which case the distortion produced by the amplifier 17 is negligible.

Figure 4:
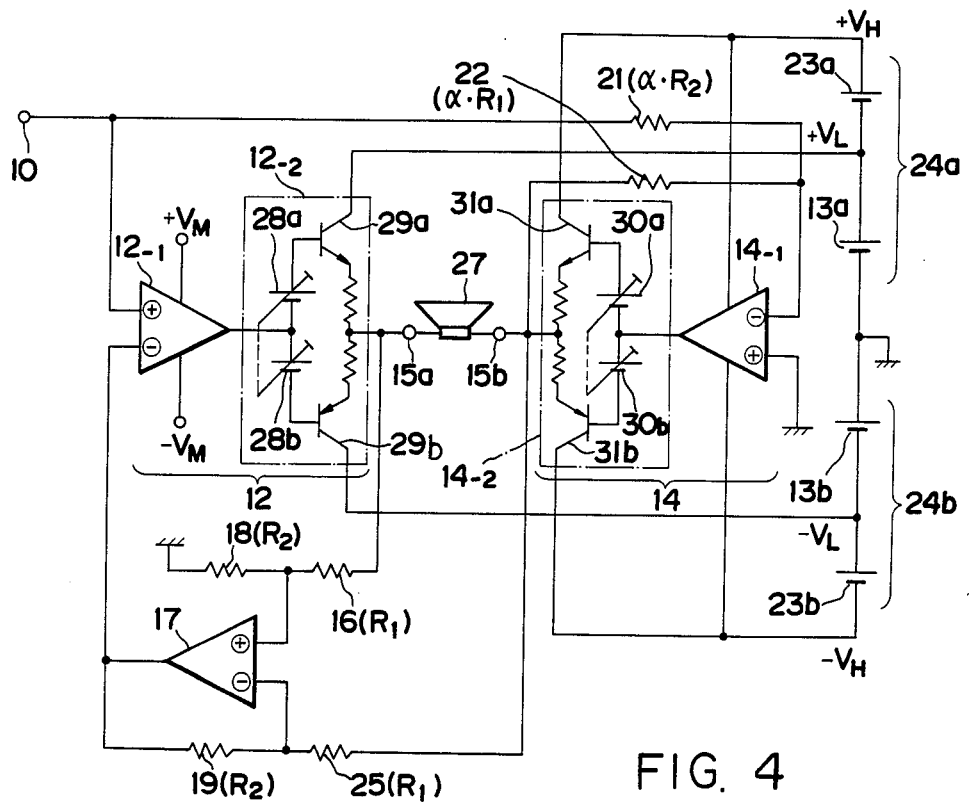
FIG. 4 is a detailed circuit diagram of the power amplifier of FIG. 2.

The power amplifier of FIG. 2 will now be described in more detail with reference to FIG. 4. The amplifier 12 is comprised of a drive-stage amplifier 12-1 and a Class-A output-stage amplifier 12-2 composed of bias voltage sources 28a and 28b and two transistors 29a and 29b arranged in a single-ended push-pull configuration. A non-inverting input terminal of the drive-stage amplifier 12-1 is connected to the input terminal 10 while its inverting input terminal is connected to the output terminal of the operational amplifier 17. The positive and negative voltage input terminals of the drive-stage amplifier 12-1 are supplied with voltage $+V_M$ and $-V_M$ ($V_H > V_M > V_L$), respectively, and voltages $+V_L$ and $-V_L$ are supplied to the collectors of the transistors 29a and 29b, respectively.

The amplifier 14 is comprised of a drive-stage amplifier 14-1 and a Class-B output-stage amplifier 14-2 composed of bias voltage sources 30a and 30b and two transistors 31a and 31b arranged in a single-ended push-pull configuration. An inverting input terminal of the drive-stage amplifier 14-1 is connected to a junction point between the resistors 21 and 22 while its non-inverting input terminal is connected to ground. The positive and negative voltage input terminals of the drive-stage amplifier 14-1 are supplied with voltages $+V_H$ and $-V_H$, respectively, and also the collectors of the transistors 31a and 31b are supplied with voltages $+V_H$ and $-V_H$, respectively. The loudspeaker 27 is connected between the terminals 15a and 15b.

Figure 5:
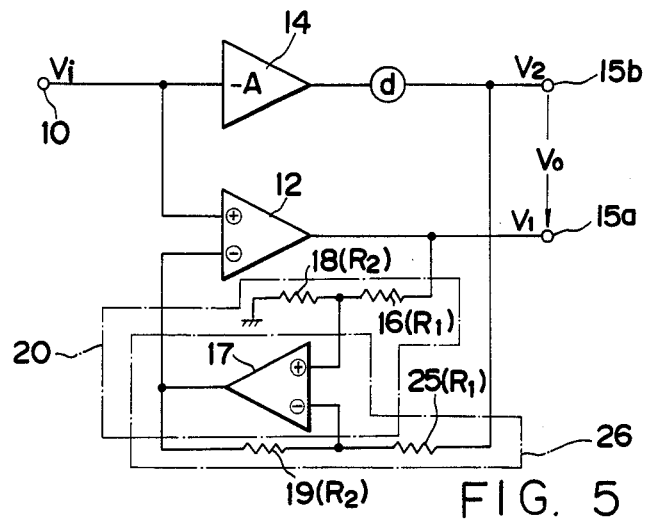
FIGS. 5 to 8 are circuit diagrams of modified power amplifiers, respectively.

According to a modified form of the invention shown in FIG. 5, an input terminal 10 is connected to a non-inverting input terminal of an amplifier 12 and an input terminal of an amplifier 14 with a gain of $-A$. The output terminal of the amplifier 12 is connected to a terminal 15a and also connected to a non-inverting input terminal of an operational amplifier 17 via a resistor 16 having a value R1, the non-inverting input terminal of the operational amplifier 17 being connected to ground via a resistor 18 having a value R2. A resistor 19 having a value R2 is coupled between the inverting input terminal and output terminal of the operational amplifier 17, the output terminal of the operational amplifier 17 being connected to the inverting input terminal of the amplifier 12. The output terminal of the amplifier 14 is connected to a terminal 15b and also connected to the inverting input terminal of the operational amplifier 17 via a resistor 25 having a value R1. A load, i.e., a loudspeaker, is connected between the terminals 15a and 15b. It is assumed that the amplifier 14 produces a distortion d.

With this construction, the relationship of Vi, V1 and V2 is expressed as follows:

$$(V1 - V2) \cdot (R2/R1) = Vi \quad (12)$$
$$V1 = (R1/R2) \cdot Vi + V2$$
$$= (R1/R2) \cdot Vi + d - A \cdot Vi$$

Therefore, if R1/R2 is equal to A (R1/R2=A), the following equation is obtained:

$$V1 = d \quad (13)$$

Therefore, the output voltage Vo is represented as follows:

$$Vo = V1 - V2 \quad (14)$$
$$= d - (d - A \cdot Vi)$$
$$= A \cdot Vi$$

Thus, the output voltage Vo does not have any distortion.

Figure 6:
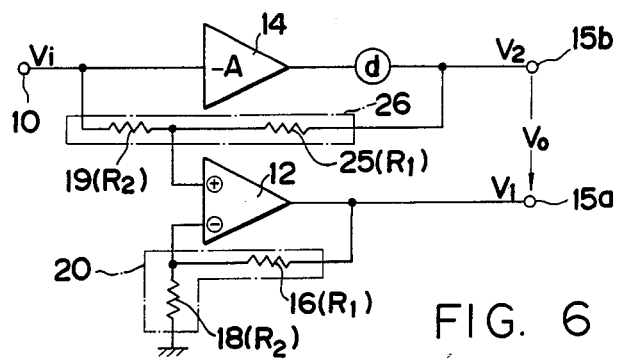

According to another modified form of the invention shown in FIG. 6, an input terminal 10 is connected to an input terminal of an amplifier 14 with a gain of $-A$ and also connected to a non-inverting input terminal of an amplifier 12 via a resistor 19 having a value R2. The output terminal of the amplifier 12 is connected to a terminal 15a and also connected to ground via a resistor 16 having a value R1 and a resistor 18 having a value R2. The junction point between the resistors 16 and 18 is connected to the inverting input terminal of the amplifier 12. The output terminal of the amplifier 14 is connected to a terminal 15b and also connected to the non-inverting input terminal of the amplifier 12 via a resistor 25 having a value R1. A load is connected between the terminals 15a and 15b. It is assumed that the amplifier 14 produces a distortion d.

With this construction, the relationship of Vi, V1 and V2 is expressed as follows:

$$(R2/(R1 + R2)) \cdot V1 = (R2/(R1 + R1)) \cdot (V2 - Vi) + Vi \quad (15)$$
$$V1 = V2 + (R1/R2) \cdot Vi$$
$$V1 = d - A \cdot Vi + (R1/R2) \cdot Vi$$

Therefore, if R1/R2 is equal to A (R1/R2=A), the following equation is obtained:

$$V1 = d \quad (16)$$

Therefore, the output voltage Vo is represented as follows:

$$Vo = V1 - V2 \quad (17)$$
$$= d - (d - A \cdot Vi)$$
$$= A \cdot Vi$$

Thus, the output voltage Vo does not have any distortion.

Figure 7:
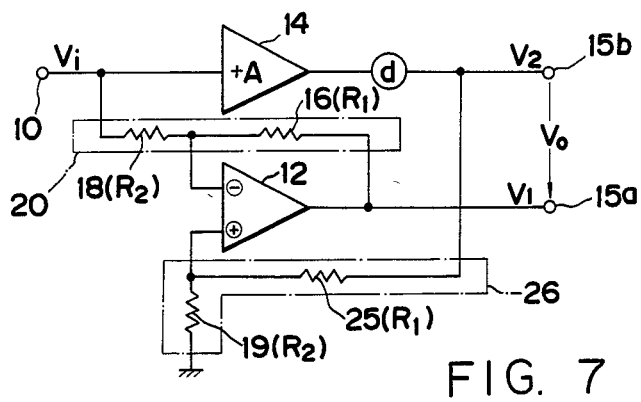

According to a further modified form of the invention shown in FIG. 7, an input terminal 10 is connected to an input terminal of an amplifier 14 with a gain A and also connected to an inverting input terminal of an amplifier 12 via a resistor 18 having a value R2. The output terminal of the amplifier 12 is connected to a terminal 15a and also connected to its inverting input terminal via a resistor 16 having a value R1. The output terminal of the amplifier 14 is connected to a terminal 15b and also connected to ground via a resistor 25 having a value R1 and a resistor 19 having a value R2. The junction point between the resistors 19 and 25 is connected to the non-inverting input terminal of the amplifier 12. A load or loudspeaker is connected between the terminals 15a and 15b. It is assumed that the amplifier 14 produces a distortion d.

With this construction, the relationship of Vi, V1 and V2 is expressed as follows:

$$(R2/(R1 + R2)) \cdot V2 = Vi - (R2/(R1 + R2)) \cdot (Vi - V1) \quad (18)$$
$$V1 = V2 - (R1/R2) \cdot Vi$$
$$V1 = A \cdot Vi + d - (R1/R2) \cdot Vi$$

Therefore, if R1/R2 is equal to A (R1/R2=A), the following equation is obtained:
$$V1 = d \quad (19)$$

Therefore, the output voltage Vo is expressed as follows:

$$Vo = V1 - V2 \quad (20)$$
$$= d - (A \cdot Vi + d)$$
$$= -A \cdot Vi$$

Thus, the output voltage Vo does not have any distortion.

Figure 8:
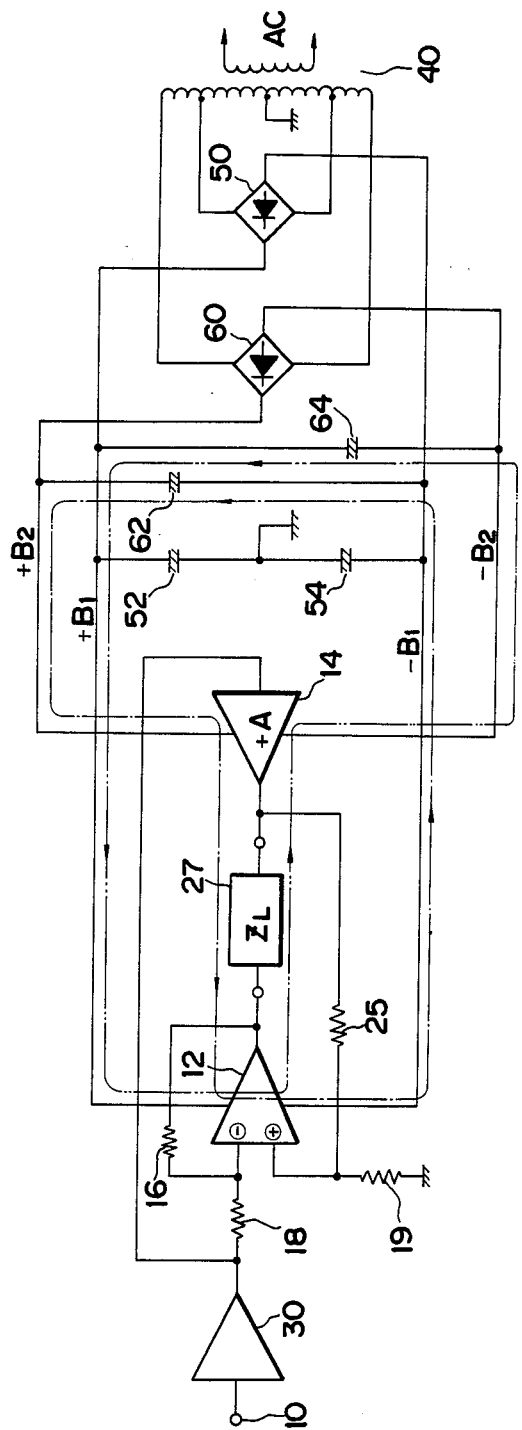

FIG. 8 shows a further modification which differs essentially from the embodiment of FIG. 7 in that a modified form of voltage source means is provided. An amplifier 12 is supplied with dc voltage from commercial ac voltage source via a transformer 40 connected thereto, a rectifier 50 and smoothing capacitors 52 and 54. An amplifier 14 is supplied with dc voltage from the ac voltage source via the transformer 40, a rectifier 60, smoothing capacitors 62 and 54 and smoothing capacitors 64 and 52. Reference numeral 30 designates a buffer amplifier. With this arrangement, the current flowing through the load 27 passes in either a path shown in a dot-and-dash line, (FIG. 8) or a path shown in a two dots-and-dash line, depending on the polarity of the signal. Thus, the current through the load 27 does not flow into ground, so that this current does not interfere with other currents flowing into ground, thereby preventing an undesirable distortion.

While the power amplifiers according to this invention have been specifically shown and described herein, the invention itself is not to be restricted to the exact showing of the drawings or the description thereof. For example, although the first amplifier 12 and the second amplifier 14 are operated in a Class-A mode and a Class-B mode, respectively, in each embodiment, the second amplifier 14 may be replaced by a Class-AB amplifier. Alternatively, the first amplifier 12 may be replaced by a Class-AB amplifier. In other words, it will suffice that the first amplifier 12 is biased to an extent greater than the second amplifier 14. Further, the second amplifier 14 may be replaced by a Class-D amplifier, i.e., a pulse width modulation amplifier.

As is clear from the foregoing, the power amplifiers according to the present invention can achieve both low distortion characteristics and a high power efficiency. In addition, the circuit elements or component parts for the first amplifier do not need to have a high voltage-resistance, so that the overall manufacturing cost of the power amplifier can be reduced. Further, the power amplifier does not require floating voltage sources, which further reduces the manufacturing cost. At the same time, the problem of common-mode noises inherent to such floating voltage sources is eliminated.

What is claimed is:

1. A power amplifier comprising:
   (a) an input terminal for being supplied with an input signal;
   (b) first and second terminals for connecting a load therebetween;
   (c) first amplifier means for being supplied with a voltage from first voltage source means to amplify said input signal to apply an output signal to said first terminal;
   (d) second amplifier means for being supplied with a voltage from second voltage source means to amplify said input signal to apply an output signal to said second terminal, said voltage from said second voltage source means being greater than said voltage from said first voltage source means, said second amplifier means having a higher power efficiency than said first amplifier means, and said first amplifier means having a lower distortion than said second amplifier means;
   (e) first feedback path means for feeding back said output signal of said first amplifying means to an input thereof; and
   (f) second feedback path means for feeding back said output signal of said second amplifier means to said input of said first amplifier means.

2. A power amplifier according to claim 1, further comprising an equalizer circuit for coinciding transfer functions of said first and second amplifier means with each other.

3. A power amplifier according to claim 2, in which said first amplifier means comprises a first amplifier having inverting and non-inverting input terminals, said input signal being applied to said non-inverting input terminal of said first amplifier, said first feedback path means comprising a second amplifier having inverting and non-inverting input terminals and series-connected first and second resistors through which an output terminal of said first amplifier is grounded, the non-inverting input terminal of said second amplifier being connected to a junction point of said first and second resistors, an output terminal of said second amplifier being connected to the inverting input terminal of said first amplifier, said second feedback path means comprising said second amplifier and series-connected third and fourth resistors through which the output of said second amplifier means is connected to the output terminal of said second amplifier, and said inverting input terminal of said second amplifier being connected to a junction point between said third and fourth resistors.

4. A power amplifier according to claim 1, in which said first amplifier means comprises a first amplifier having inverting and non-inverting input terminals, said input signal being applied to said non-inverting input terminal of said first amplifier, said first feedback path means comprising a second amplifier having inverting and non-inverting input terminals and series-connected first and second resistors through which an output terminal of said first amplifier is grounded, the non-inverting input terminal of said second amplifier being connected to a junction point of said first and second resistors, an output terminal of said second amplifier being connected to the inverting input terminal of said first amplifier, said second feedback path means comprising said second amplifier and series-connected third and fourth resistors through which the output of said second amplifier means is connected to the output terminal of said second amplifier, and the inverting input terminal of said second amplifier being connected to a junction point between said third and fourth resistors.

5. A power amplifier according to claim 1, in which said first amplifier means comprises an amplifier having inverting and non-inverting input terminals, said first feedback path means comprising series-connected first and second resistors through which an output terminal of said amplifier is grounded, said inverting input terminal of said amplifier being connected to a junction point between said first and second resistors, said second feedback path means comprising series-connected third and fourth resistors connected between the input and output of said second amplifier means, and said non-inverting input terminal of said amplifier being connected to a junction point of said third and fourth resistors.

6. A power amplifier according to claim 1, in which said first amplifier means comprises an amplifier having inverting and non-inverting input terminals, said first feedback path means comprising series-connected first and second resistors through which an input of said second amplifier means is connected to an output terminal of said amplifier, said inverting input terminal of said amplifier being connected to a junction point of said first and second resistors, said second feedback path means comprising series-connected third and fourth resistors through which an output of said second amplifier means is grounded, and said non-inverting input terminal of said amplifier being connected to a junction point of said third and fourth resistors.

7. A power amplifier according to claim 6, in which said first voltage source means comprises series-connected first and second voltage sources having the same output voltage, a junction point of said first and second voltage sources being grounded, a positive output terminal of said first voltage source means being connected to a positive voltage input terminal of said first amplifier means while a negative output terminal of said first voltage source means is connected to a negative voltage input terminal of said first amplifier means, said second voltage source means comprising a third voltage source having a negative output terminal connected to the negative output terminal of said first voltage source means and a positive output terminal connected to a positive voltage input terminal of said second amplifier means, and a fourth voltage source having a positive output terminal connected to the positive output terminal of said first voltage source means and a negative output terminal connected to a negative voltage input terminal of said second amplifier.

8. A power amplifier according to claim 7, in which said first amplifier means is biased to an extent greater than said second amplifier means.

9. A power amplifier according to claim 8, in which said first amplifier means comprises a Class-A amplifier while said second amplifier means comprises a Class-AB amplifier.

10. A power amplifier according to claim 8, in which said first amplifier means comprises a Class-AB amplifier while said second amplifier means comprises a Class-B amplifier.

11. A power amplifier according to claim 8, in which said first amplifier means comprises a Class-A amplifier while said second amplifier means comprises a Class-B amplifier.

12. A power amplifier according to claim 7, in which said first amplifier means comprises a Class-A amplifier while said second amplifier means comprises a Class-D amplifier.

13. A power amplifier according to claim 7, in which said first amplifier means comprises a Class-AB amplifier while said second amplifier means comprises a Class-D amplifier.

14. A power amplifier according to claim 1, in which said first amplifier means is biased to an extent greater than said second amplifier means.

15. A power amplifier according to claim 14, in which said first amplifier means comprises a Class-A amplifier while said second amplifier means comprises a Class-AB amplifier.

16. A power amplifier according to claim 14, in which said first amplifier means comprises a Class-AB amplifier while said second amplifier means comprises a Class-B amplifier.

17. A power amplifier according to claim 14, in which said first amplifier means comprises a Class-A amplifier while said second amplifier means comprises a Class-B amplifier.

18. A power amplifier according to claim 1, in which said first amplifier means comprises a Class-A amplifier while said second amplifier means comprises a Class-D amplifier.

19. A power amplifier according to claim 1, in which said first amplifier means comprises a Class-AB amplifier while said second amplifier means comprises a Class-D amplifier.

* * * * *